USO10414265B2

(12) United States Patent
Ishikawa

(10) Patent No.: US 10,414,265 B2
(45) Date of Patent: Sep. 17, 2019

(54) CONNECTION MEMBER FOR COOLANT PASSAGES AND COOLER SYSTEM

(71) Applicant: TOYOTA JIDOSHA KABUSHIKI KAISHA, Toyota-shi, Aichi-ken (JP)

(72) Inventor: Keitaro Ishikawa, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 374 days.

(21) Appl. No.: 15/253,129

(22) Filed: Aug. 31, 2016

(65) Prior Publication Data

US 2017/0067589 A1 Mar. 9, 2017

(30) Foreign Application Priority Data

Sep. 4, 2015 (JP) ................... 2015-174861

(51) Int. Cl.
| | |
|---|---|
| F16L 45/00 | (2006.01) |
| B60K 11/02 | (2006.01) |
| F28F 9/26 | (2006.01) |
| F28F 3/08 | (2006.01) |
| F28F 3/12 | (2006.01) |
| H05K 7/20 | (2006.01) |

(52) U.S. Cl.
CPC ............... B60K 11/02 (2013.01); F28F 3/08 (2013.01); F28F 3/12 (2013.01); F28F 9/26 (2013.01); H05K 7/20927 (2013.01); B60Y 2306/05 (2013.01); F28F 2230/00 (2013.01); F28F 2275/20 (2013.01)

(58) Field of Classification Search
CPC ....... F16L 43/00; F16L 43/008; F16L 43/005; F16L 45/00

USPC .. 285/56, 134.1, 135.1, 135.4, 135.5, 126.1, 285/179.1

See application file for complete search history.

(56) References Cited

U.S. PATENT DOCUMENTS

| | | | | |
|---|---|---|---|---|
| 728,985 | A | * | 5/1903 | Ryan ................................. 4/343 |
| 1,864,879 | A | * | 6/1932 | Youker ................... F16L 43/00 |
| | | | | 285/135.5 |
| 3,994,031 | A | * | 11/1976 | Bishop .................... E03C 1/284 |
| | | | | 4/679 |
| 2014/0140118 | A1 | | 5/2014 | Ishikawa et al. |
| 2015/0152987 | A1 | | 6/2015 | Ishikawa |

FOREIGN PATENT DOCUMENTS

| | | |
|---|---|---|
| CN | 104701279 A | 6/2015 |
| JP | S56-072094 U | 6/1981 |
| JP | 2008-303931 A | 12/2008 |

(Continued)

Primary Examiner — Aaron M Dunwoody
(74) Attorney, Agent, or Firm — Oliff PLC

(57) ABSTRACT

A connection member for coolant passages is provided. The connection member includes: a first end portion configured to be connected to the first opening via a shaft seal member; a second end portion configured to be connected to the second opening via a face seal member; a communication portion providing communication between the first end portion and the second end portion; a first fastening portion provided at a position in one direction such that a distance between the first fastening portion and the second end portion is larger than a distance between the first fastening portion and the first end portion; and a second fastening portion provided around the second end portion, and configured to be fastened to the case.

2 Claims, 7 Drawing Sheets

(56) References Cited

FOREIGN PATENT DOCUMENTS

| JP | 2012-064724 A | 3/2012 |
|----|---------------|--------|
| JP | 2014-102017 A | 6/2014 |
| JP | 2015-109322 A | 6/2015 |

* cited by examiner

CONNECTION MEMBER FOR COOLANT PASSAGES AND COOLER SYSTEM

INCORPORATION BY REFERENCE

The disclosure of Japanese Patent Application No. 2015-174861 filed on Sep. 4, 2015 including the specification, drawings and abstract is incorporated herein by reference in its entirety.

BACKGROUND

1. Technical Field

The present disclosure relates to a connection member for coolant passages, the connection member connecting a first coolant passage that communicates with a first opening and a second coolant passage that communicates with a second opening, and a cooler system which includes the connection member.

2. Description of Related Art

Japanese Patent Application Publication No. 2014-102017 discloses an inverter to be installed in a vehicle. The inverter includes a first casing, a coolant passage (e.g. second coolant passage), an opening (e.g. second opening) that communicates with the coolant passage, and a second casing fixed to a bottom face of the first casing. The first casing houses a stacked cooling unit integrated with a plurality of power cards each housing a switching element (e.g. semiconductor element). A first connection tube (e.g. bush) is inserted through a through-hole formed in the first casing of the inverter, and the first connection tube is connected to a rigid tube (e.g. first coolant passage) extending from the stacked cooling unit, via a shaft seal member. Also, a face seal member is disposed between a flange of the first connection tube and the first casing. The flange of the first connection tube is fixed to the first casing via a bolt. Also, in the first casing, an opening (e.g. first opening) is defined by an end portion, on the side opposite to the rigid tube, of the through-hole (e.g. coolant flow hole) of the first connection tube. Furthermore, an end of a U-shaped second connection tube fixed to the second casing via a bolt is connected to the opening (e.g. first opening) of the first casing, the opening being defined by the bush, via a shaft seal member, and another end of the second connection tube is connected to the opening (e.g. second opening) of the second casing via a face seal member. A cooling medium is supplied from a coolant pump disposed outside the first casing to a coolant inlet of the stacked cooling unit. The cooling medium flowing through the stacked cooling unit takes heat from the power cards and a temperature of the cooling medium thereby increases, and the cooling medium flows into the coolant passage in the second casing via the rigid tube, and the first connection tube and the second connection tube. The cooling medium flowing through the coolant passage in the second casing takes heat from the first casing and the temperature of the cooling medium thereby increases, and the cooling medium flows into a radiator disposed outside the second casing.

SUMMARY

In the above inverter, the second connection tube is fixed to the second casing via a bolt. Depending on a position of a fastening portion via which the second connection tube is fastened to the second casing and/or a distance between fastening portions, deformation of the second connection tube according to an ambient temperature is limited, which results in increase of stress on a particular part. Such increase of stress on the particular part may cause decrease in durability of the second connection tube.

A present disclosure further enhances a durability of a connection member for coolant passages, the connection member including a plurality of fastening portions to be fastened to a case.

According to one aspect of the disclosure, a connection member for coolant passages is provided. The coolant passages include a first coolant passage and a second coolant passage. The first coolant passage is provided in a case. The first coolant passage communicates with a first opening provided in the case. The second coolant passage is provided in the case at a distance in one direction from the first opening. The second coolant passage communicates with a second opening. The connection member includes: a first end portion; a second end portion; a communication portion; a first fastening portion; and a second fastening portion. The first end portion is configured to be connected to the first opening via a shaft seal member, and has a tubular shape. The second end portion is configured to be connected to the second opening via a face seal member, and has a tubular shape. The communication portion provides communication between the first end portion and the second end portion. The first fastening portion provided at a position in the one direction such that a distance between the first fastening portion and the second end portion is larger than a distance between the first fastening portion and the first end portion. The first fastening portion is configured to be fastened to the case. The second fastening portion is provided around the second end portion. The second fastening portion is configured to be fastened to the case.

The connection member connects a first coolant passage and a second coolant passage. The first coolant passage communicates with a first opening provided in a case. The second coolant passage communicates with a second opening provided in the case, at a distance in one direction from the first opening. The connection member includes: a tubular first end portion connected to the first opening via a shaft seal member; a tubular second end portion connected to the second opening via a face seal member; a communication portion that provides communication between the first end portion and the second end portion; and a first fastening portion and a second fastening portion each configured to be fastened to the case. The first fastening portion is provided at a position at which the first fastening portion is further away in the one direction from the second end portion relative to the first end portion. The second fastening portion is provided around the second end portion. Consequently, the connection member enables expansion of a distance in the one direction between a fastening point of the first fastening portion and a fastening point of the second fastening portion, that is, an allowable range of deformation of the connection member according to an ambient temperature. Therefore, increase of stress on a particular part of the connection member due to limitation of deformation of the connection member can favorably be prevented. As a result, a durability of the connection member for coolant passages, the connection member including a plurality of fastening portions configured to be fastened to the case, can be further enhanced.

According to the above mentioned aspect, the number of the first fastening portion included in the connection member may be one, and the number of the second fastening portion included in the connection member may be at least two. Consequently, favorable scalability of the face seal member can be ensured while the distance in the one direction between the fastening point of the first fastening portion and the fastening point of the second fastening portion is made to be longer.

According to the above mentioned aspect, the connection member may further include a body and a cover member. The body may have an opening portion which communicates with the first end portion and the second end portion on a side opposite to the case. The body may include the first fastening portion and the second fastening portion. The body and the cover member may be each made of a resin. The cover member may be welded to the body so as to occlude the opening portion. The case may be made of a metal.

Employment of such configuration above enables a U-shaped connection member to be easily formed using a resin. In addition, in the connection member, the distance in the one direction between the fastening point of the first fastening portion and the fastening point of the second fastening portion is made to be longer, enabling decrease of stress generated on a portion of the welding between the body and the cover member, which are each made of a resin, and thus enabling enhancement in durability of the connection member. In addition, even when there is a difference in linear expansion coefficient (or heat expansion coefficient) between the case and the connection member, the increase in length of the distance in the one direction between the fastening points of the first fastening portion and the second fastening portion each following the case enables favorable prevention of increase of stress on a particular part of the connection member due to limitation of deformation of the connection member according to an ambient temperature.

According to another aspect of the disclosure, a cooler system is provided. The cooler system includes a case and a connection member. The case includes coolant passages including a first coolant passage and a second coolant passage. The first coolant passage is provided in the case, and communicates with a first opening provided in the case. The second coolant passage is provided in the case at a distance in one direction from the first opening, and communicates with a second opening. The connection member includes: a first end portion; a second end portion; a communication portion; a first fastening portion; and a second fastening portion. The first end portion is connected to the first opening via a shaft seal member, and has a tubular shape. The second end portion is connected to the second opening via a face seal member, and has a tubular shape. The communication portion provides communication between the first end portion and the second end portion. The first fastening portion is provided at a position in the one direction such that a distance between the first fastening portion and the second end portion is larger than a distance between the first fastening portion and the first end portion. The first fastening portion is fastened to the case. The second fastening portion is provided around the second end portion, and is fastened to the case. The case houses a cooler that cools an electronic component included in an inverter that drives a motor. The first coolant passage is connected to the cooler, and the second coolant passage is provided in the case. Consequently, the inverter can be cooled by both the cooler and a cooling medium flowing in the second coolant passage.

BRIEF DESCRIPTION OF THE DRAWINGS

Features, advantages, and technical and industrial significance of exemplary embodiments will be described below with reference to the accompanying drawings, in which like numerals denote like elements, and wherein.

DETAILED DESCRIPTION OF EMBODIMENTS

Next, an embodiment according to the present disclosure will be described with reference to the drawings. Hereinafter, an up-down direction refers to an up-down direction in a vertical direction.

Figure 1:
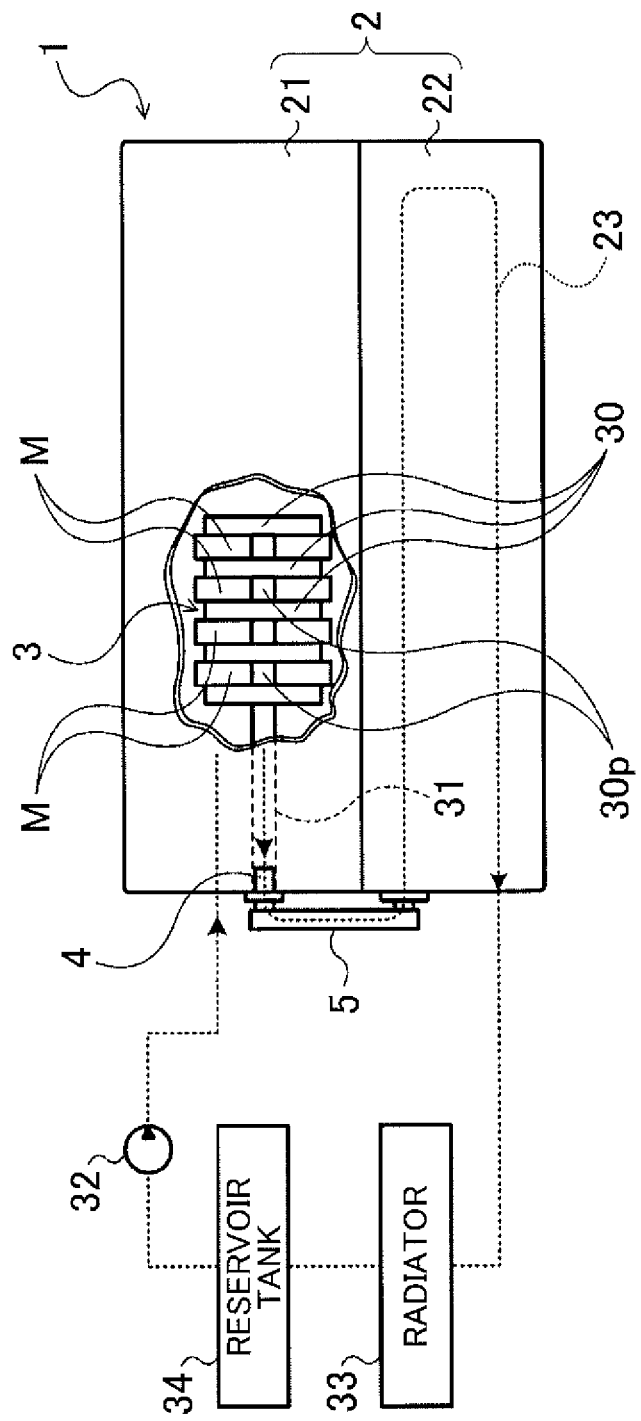
FIG. 1 is a schematic configuration diagram illustrating a power control unit including a connection member for coolant passages according to the present disclosure.
Figure 2:
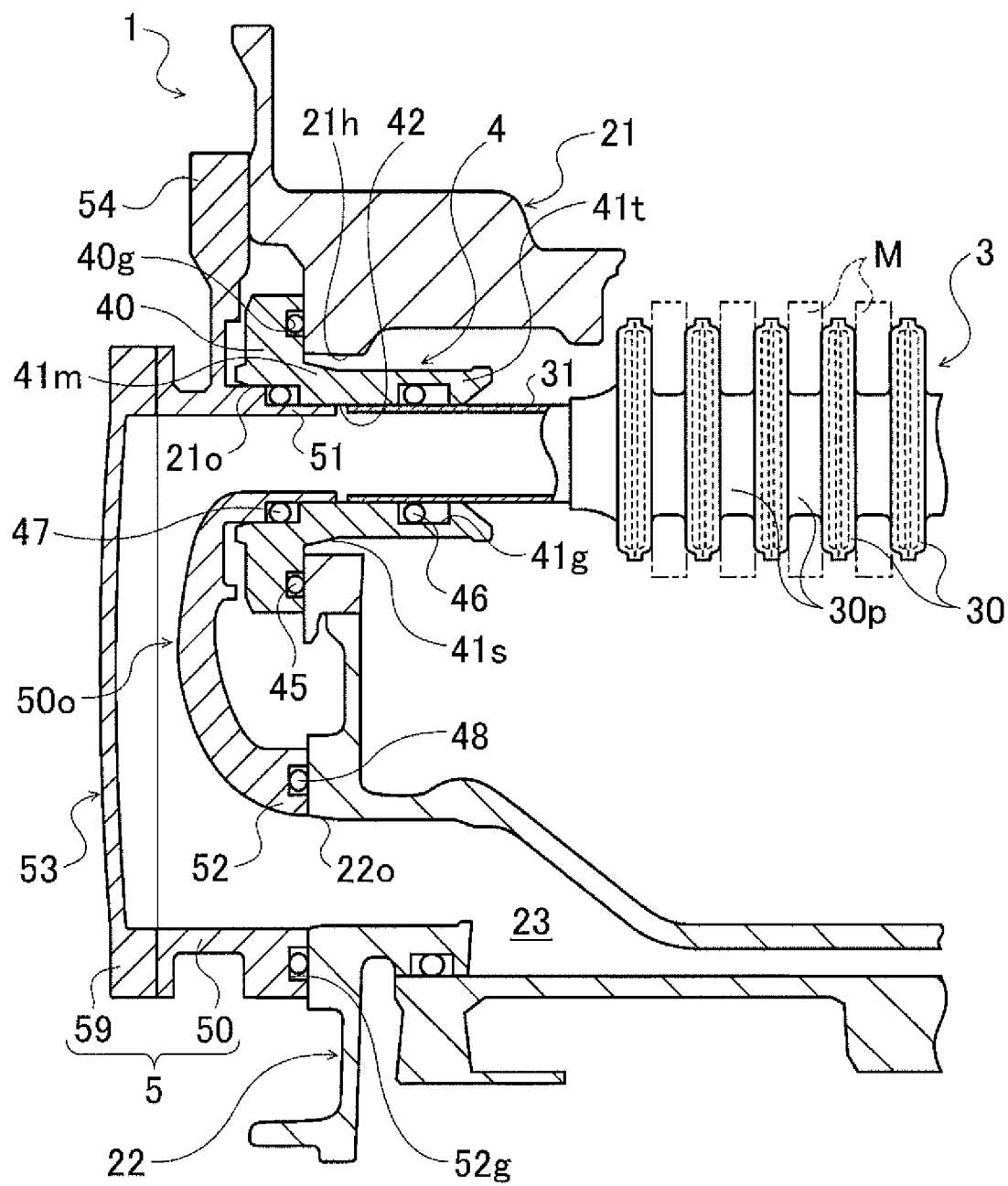
FIG. 2 is an enlarged sectional view of a major part of the power control unit illustrated in FIG. 1.

FIG. 1 is a schematic configuration diagram illustrating a cooler system according to the present disclosure and a power control unit (hereinafter referred to as "PCU") 1 including a connection member for coolant passages, and FIG. 2 is an enlarged sectional view of a major part of the PCU 1. The cooler system includes a case 2 that houses the PCU 1, and the connection member. The coolant passage is disposed inside the case 2. The PCU 1 illustrated in FIGS. 1 and 2 is intended to drive a synchronous generator-motor (e.g. an alternate-current motor) installed in a non-illustrated hybrid automobile or electric automobile, and is disposed, for example, inside a compartment provided in a front portion of the automobile, together with an engine and/or a motor. The PCU 1 includes, for example, a voltage conversion module (e.g. a boost converter) that boosts a voltage of power from a non-illustrated battery, which is a lithium ion secondary battery or a nickel metal-hydride secondary battery, a capacitor module, an inverter that drives the motor, and a case 2 that houses the voltage conversion module, the capacitor module, the inverter, etc.

As illustrated in FIGS. 1 and 2, the case 2 includes a first case 21 positioned on the upper side when the PCU 1 is installed in a vehicle, and a second case 22 positioned on the lower side when the PCU 1 is installed in the vehicle. In the present embodiment, the first case 21 and the second case 22 are formed by, for example, casting a metal such as an aluminum alloy. The first case 21 houses a stacked cooler 3 in addition to the voltage conversion module, the capacitor module, the inverter, etc. The stacked cooler 3 is configured to cool a plurality of semiconductor modules M, which are electronic components included in the inverter or the voltage conversion module. The second case 22 is fixed to a lower portion of the first case 2, and inside the second case 22, a coolant passage 23 extending in a U-shape along a joining surface between the first case 21 and the second case 22 is formed. In FIG. 1, for ease of description, the coolant passage 23 is illustrated as one extending in a U-shape along the up-down direction in the figure.

As illustrated in FIGS. 1 and 2, the stacked cooler 3 includes a plurality of coolers 30 fanned so as to be hollow and flat using a metal having high thermal conductivity such as copper or an aluminum alloy. The plurality of coolers 30 are disposed (e.g., stacked) in such a manner that the coolers 30 and the semiconductor modules M including the inverter and the voltage conversion module are arranged alternately. In other words, for one semiconductor module M, two coolers 30 are disposed so as to abut on a front face or a back face of the semiconductor module M. Also, in each of opposite end portions in a width direction of each cooler 30, a through-hole is fainted. The through-hole on one side in the width direction of each cooler 30 is connected to the through-hole on one side in the width direction of an adjacent cooler 30 via a communication tube 30p, and the through-hole on the other side in the width direction of each cooler 30 is connected to the through-hole on the other side of an adjacent cooler 30 via a communication tube 30p.

Furthermore, a non-illustrated coolant inflow tube, and a coolant outflow tube 31, which is a tubular first coolant passage arranged inside the first case 21, are connected to the cooler 30 positioned on the leftmost side in FIG. 2. In the present embodiment, the coolant inflow tube and the coolant outflow tube 31 are made of a material that is the same as that of the coolers 30. Also, the stacked cooler 3, the coolant inflow tube and the coolant outflow tube 31 are attached to the inside of the first case 21 so as to be slightly movable in the up-down direction in their entireties when the PCU 1 is installed in a vehicle. An outlet of the coolant pump 32 is connected to the coolant inflow tube connected to the stacked cooler 3 (or cooler 30), via, e.g., a non-illustrated tubing. Also, as illustrated in FIGS. 1 and 2, the coolant outflow tube 31 is connected to one end of the coolant passage (e.g. a second coolant passage) 23 formed in the second case 22 via a first connection tube 4 attached to the first case 21 and a second connection tube 5 connected to the first connection tube 4. The first connection tube 4, which is an example of a first connection member, is a bush. Also, the second connection tube 5 is an example of the second connection member. As illustrated in FIG. 2, the one end of the coolant passage 23 communicates with a second opening 22o formed in a side wall portion of the second case 22, and another end of the coolant passage 23 communicates with a coolant inlet of a radiator 33 via a non-illustrated tubing. A coolant outlet of the radiator 33 is connected to a reservoir tank 34 via a non-illustrated tubing.

The coolant pump 32 sucks in a cooling medium, for example, a LLC (e.g. long-life coolant) with an ethylene glycol-based antifreeze liquid mixed therein from the reservoir tank 34 and feeds the cooling medium to the coolant inflow tube under pressure. The cooling medium supplied via the coolant inflow tube to the cooler 30 closest to the coolant inflow tube sequentially flows into the adjacent coolers 30. Then, when flowing through each cooler 30, the cooling medium takes heat from, e.g., the semiconductor modules M that are in abutment with the cooler 30, and a temperature of the cooling medium thereby increases. The cooling medium flowing out from the coolers 30 flows into the coolant outflow tube 31. Then, the cooling medium flows into the coolant passage 23 of the second case 22 via the first connection tube 4 and the second connection tube 5. When flowing through the coolant passage 23, the cooling medium takes heat on the first case 21 side and the temperature of the cooling medium thereby increases, and the cooling medium then flows into the radiator 33. The cooling medium cooled by the radiator 33 is returned to the reservoir tank 34. Consequently, the cooling medium supplied in circulation into the plurality of coolers 30 can cool, e.g., the plurality of semiconductor modules M via the respective coolers 30, and when flowing through the coolant passage 23 of the second case 22, the cooling medium can cool, for example, a reactor of the voltage conversion module, the capacitor module, etc., housed in the first case 21, via a bottom portion of the first case 21.

Figure 3:
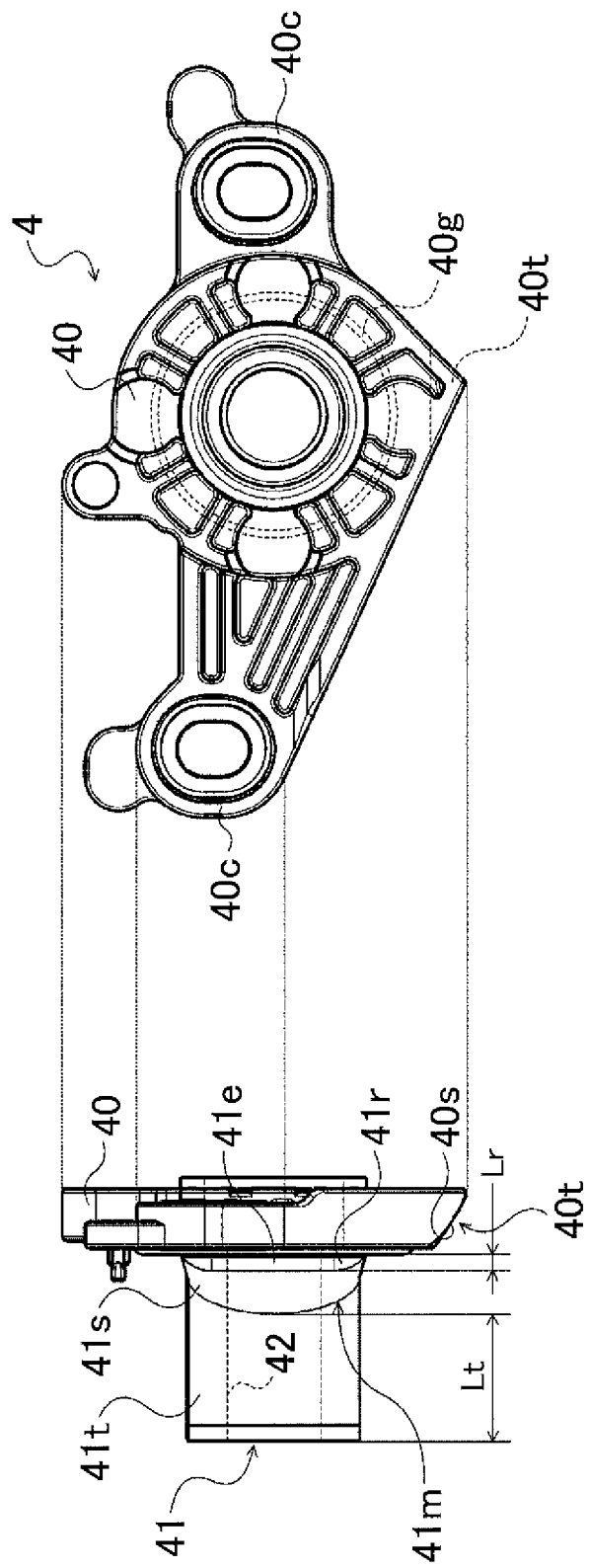
FIG. 3 includes a front view and a side view of a bush to which the connection member according to the present disclosure is connected.

As illustrated in FIGS. 2 and 3, the first connection tube 4 includes a flange portion 40 fixed to the first case 21 that houses the stacked cooler 3, a cylindrical portion 41 extending from the flange portion 40, and a coolant flow hole 42 extending through the flange portion 40 and the cylindrical portion 41. In the present embodiment, the first connection tube 4 is made of a resin, and the flange portion 40 and the cylindrical portion 41 are integrally molded with the resin. However, the first connection tube 4 may be made of, for example, a metal, and may be made of a material that is the same as that of the case 2, In an end face on the cylindrical portion 41 side (e.g. inner face) of the flange portion 40, an annular seal ring groove 40g that allows an O-ring 45, which is a face seal member, to be disposed therein is formed so as to surround the cylindrical portion 41. In the present description, "face seal member" refers to a seal member disposed between respective end faces of two members each including a fluid flowing passage (or flowing hole), to seal a gap between the two members. Also, as illustrated in FIG. 3, in the flange portion 40, two flange fastening portions 40c are formed so as to face each other in a radial direction of the seal ring groove 40g via the seal ring groove 40g. Each flange fastening portion 40c includes a bolt hole, and is fastened to the first case 21 via a non-illustrated bolt inserted through the bolt hole and threadably connected to a screw hole formed in the first ease 21. Furthermore, as illustrated in FIG. 3, in the lower part in the figure of the flange portion 40, a tapered portion 40t including an inclined surface 40s inclined further away from the cylindrical portion 41 of the flange portion 40 toward the lower side of the figure is formed.

As illustrated in FIGS. 2 and 3, the cylindrical portion 41 of the first connection tube 4 includes a root portion 41r on the flange portion 40 side, a distal end portion 41t and an intermediate portion 41m. The distal end portion 41t is inserted through a through-hole (e.g. a round hole) 21h formed in the first case 21 and connected to the coolant outflow tube 31. The intermediate portion 41m includes an inclined surface 41s connecting the root portion 41r and the distal end portion 41t. The root portion 41r of the cylindrical portion 41 includes a pair of diameter-increased portions 41e facing each other in a radial direction across the coolant flow hole 42, each of the diameter-increased portions 41e being a part of the cylindrical portion 41, the part having a diameter increased along the radial direction of the cylindrical portion 41. In the present embodiment, an outer peripheral face of each diameter-increased portion 41e is, for example, a cylindrical surface having a curvature radius that is slightly smaller than that of an inner diameter of the through-hole 21h of the first case 21 so that the outer peripheral face can be in contact with the inner peripheral face of the through-hole 21h. Also, an outer peripheral face of a part of the root portion 41r, the part connecting the two diameter-increased portions 41e, is an elliptic cylindrical surface having a minor axis that is smaller than the curvature radius of the diameter-increased portions 41e.

As illustrated in FIG. 2, the distal end portion 41t of the cylindrical portion 41 is thinner than the root portion 41r, that is, has a diameter that is smaller than the inner diameter of the through-hole 21h of the first case 21. Therefore, the intermediate portion 41m is thinner than the root portion 41r except a part of the intermediate portion 41m, the part being a boundary with the root portion 41r. Also, in an inner peripheral face of the distal end portion 41t, an annular seal ring groove 41g in which an O-ring 46, which is a shaft seal member, is disposed is formed. In the present description, "shaft seal member" refers to a seal member disposed between an outer peripheral face of a tubular material and an inner peripheral face of a member surrounding the tubular material (e.g. another tubular material or a member including a hole) to seal a gap between the tubular material and the member surrounding the tubular material. Furthermore, as illustrated in FIG. 3, an axial length Lt of the distal end portion 41t is set to be longer than an axial length Lr of the root portion 41r and an axial length of the intermediate portion 41m. Also, as illustrated in FIG. 2, an inner diameter on the distal end portion 41t side of the coolant flow hole 42 is set to be slightly larger than an outer diameter of the coolant outflow tube 31, and an end portion on the flange portion 40 side of the coolant flow hole 42 has an inner diameter increased so as to be larger than the inner diameter on the distal end portion 41t side.

Figure 4:
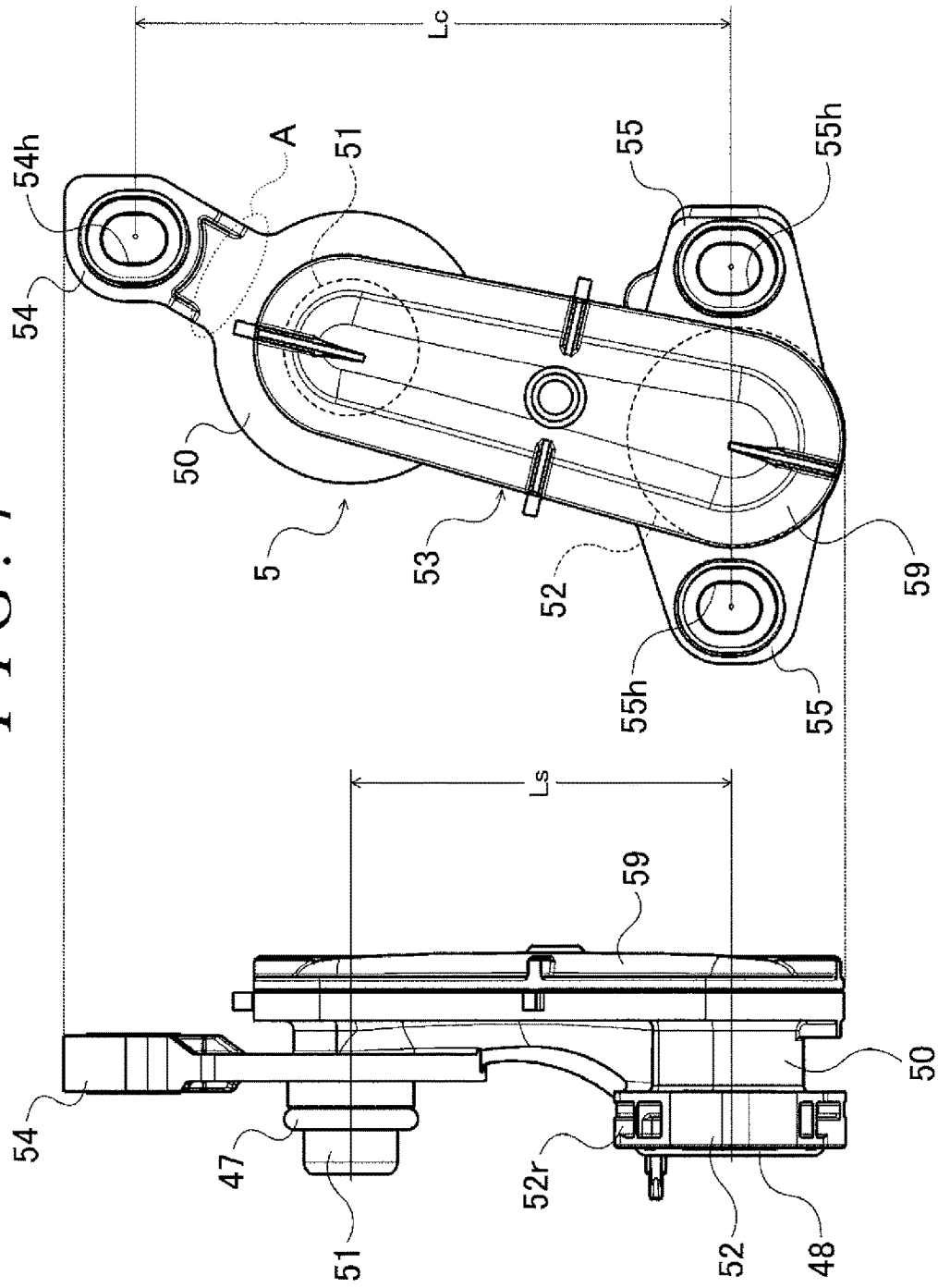
FIG. 4 includes a front view and a side view of the connection member according to the present disclosure.

The second connection tube 5 includes a body 50 and a cover member 59 joined to the body 50. Both of the body 50 and the cover member 59 are made of a resin. In the present embodiment, both of the body 50 and the cover member 59 are made of a resin that is the same as the resin of the first connection tube 4. However, the second connection tube 5 may be made of, for example, a metal, and may be made of a material that is the same as that of the case 2. As illustrated in FIGS. 2 and 4, the body 50 includes a short cylindrical first end portion 51, a second end portion 52, and an opening portion 50o. The first end portion has a cylindrical shape. The second end portion has a short cylindrical shape and extends substantially in parallel to the first end portion 51, and an opening portion 50o. The first end portion 51 and the second end portion 52 open in the opening portion 50o. As illustrated in FIG. 2, the cover member 59 is welded to an end face of a wall portion defining the opening portion 50o of the body 50 so as to occlude the opening portion 50o. The body 50 and the cover member 59 form a communication portion 53 that brings the first end portion 51 and second end portion 52 into communication with each other. Consequently, the second connection tube 5 having a U-shape can easily be formed using a resin.

An outer diameter of the first end portion 51 is set to be slightly smaller than the inner diameter of the end portion on the flange portion 40 side of the coolant flow hole 42. Also, as illustrated in FIG. 2, a distal end portion of the first end portion 51 has a decreased diameter, and an O-ring 47, which is a shaft seal member, is fitted on the distal end portion of the diameter-decreased first end portion 51. Furthermore, in an end face of the second end portion 52, an annular seal ring groove (e.g. a seal support portion) 52g in which an O-ring 48, which is a face seal member, is disposed, is formed so as to surround an opening of the second end portion 52. In addition, as illustrated in FIG. 4, in the upper portion in FIG. 4 of an outer peripheral face of the second end portion 52, a water receiving groove 52r extending in a circumferential direction of the second end portion 52 is formed.

Also, the body 50 of the second connection tube 5 includes one first fastening portion 54 and two second fastening portions 55. Each of the second fastening portions is an example of a fastening portion. As illustrated in FIG. 4, the first fastening portion 54 is formed further away in the up-down direction in FIG. 4 from the second end portion 52 relative to the first end portion 51, and is positioned on the side opposite to the second end portion 52 with reference to the first end portion 51. The first fastening portion 54 includes a bolt hole 54h, and is fastened to the first case 21 via a non-illustrated bolt inserted through the bolt hole 54h and threadably connected to a screw hole formed in the first case 21. The two second fastening portions 55 are formed in a part of the body 50 around the second end portion 52 so as to face each other in the radial direction across the second end portion 52. Each second fastening portion 55 includes a bolt hole 55h, and is fastened to the second case 22 via a non-illustrated bolt inserted through the bolt hole 55h and threadably connected to a screw hole formed in the second case 22.

Furthermore, as illustrated in FIG. 4, the first fastening portion 54 and the second fastening portions 55 are formed so as to satisfy Lc>Ls where "Lc" is a distance between a fastening point of the first fastening portion 54, that is, the center of the bolt hole 54h, and a straight line connecting the respective fastening points of the two second fastening portions 55, that is, the centers of the bolt holes 55h and "Ls" is a distance between the first end portion 51, that is, the center of the O-ring 47, and the second end portion 52, that is, the center of the O-ring 48. Also, in the second connection tube 5 in the present embodiment, as illustrated in FIG. 4, part A positioned between the first end portion 51 and the first fastening portion 54 of the body 50, that is, outside a wall portion of the body 50, the wall portion defining the opening portion 50o, is thin and narrow.

Next, a procedure for assembling the first connection tube 4 and the second connection tube 5 to the case 2 will be described.

Figure 5:
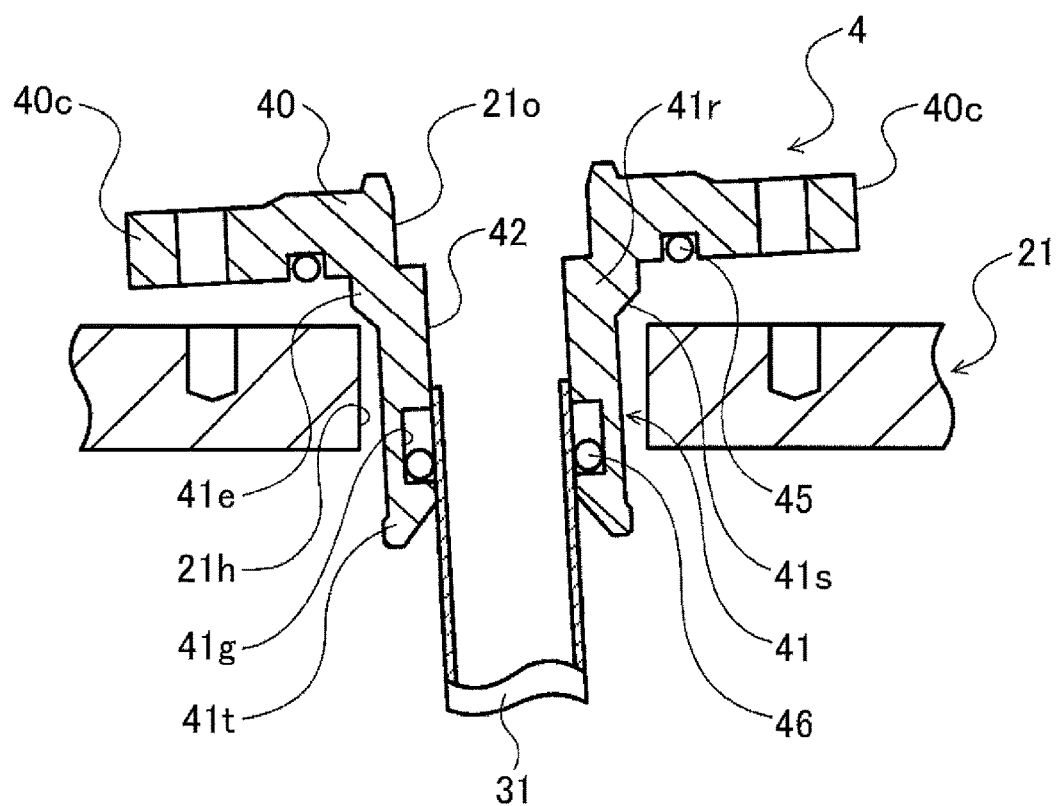
FIG. 5 is a sectional view illustrating a procedure for assembling the bush in FIG. 3 to a case.

For attaching the first connection tube 4 configured as described above to the first case 21 of the case 2, the distal end portion 41t of the cylindrical portion 41 of the first connection tube 4 is inserted through the through-hole 21h of the first case 21 in a state in which the diameter-increased portions 41e of the root portion 41r of the first connection tube 4 extend, for example, in a direction substantially perpendicular to the up-down direction when the PCU 1 is installed in a vehicle, and the coolant outflow tube 31 of the stacked cooler 3 is inserted to the distal end portion 41t of the first connection tube 4 and the O-ring 46. Here, since the distal end portion 41t and the intermediate portion 41m of the cylindrical portion 41 are thinner than the root portion 41r, as illustrated in FIG. 5, a sufficient space is secured between an outer peripheral face of the distal end portion 41t and the inclined surface 41s of the intermediate portion 41m, and the inner peripheral face of the through-hole 21h. Therefore, when the first connection tube 4 and the coolant outflow tube 31 are connected, even when the coolant outflow tube 31 is slightly inclined in the up-down direction when the PCU 1 is installed in a vehicle, movement of the first connection tube 4 and the coolant outflow tube 31 in a radius direction of the through-hole 21h is allowed, enabling alignment of the first connection tube 4 (e.g. the distal end portion 41t) and the coolant outflow tube 31 by a reactive force of the O-ring 46 crushed between the first connection tube 4 and the coolant outflow tube 31, and also enabling an amount of crushing of the O-ring 46 to be substantially uniform in its entirety in a circumferential direction. As a result of the amount of crushing of the O-ring 46 being substantially uniform in its entirety in the circumferential direction, a load of the first connection tube 4 being pushed onto the coolant outflow tube 31 can be made to be small, enabling prevention of deformation of the plurality of coolers 30 in the stacked cooler 3 in the direction in which the first connection tube 4 is pushed onto the coolant outflow tube 31 by the pushing load.

Figure 6:
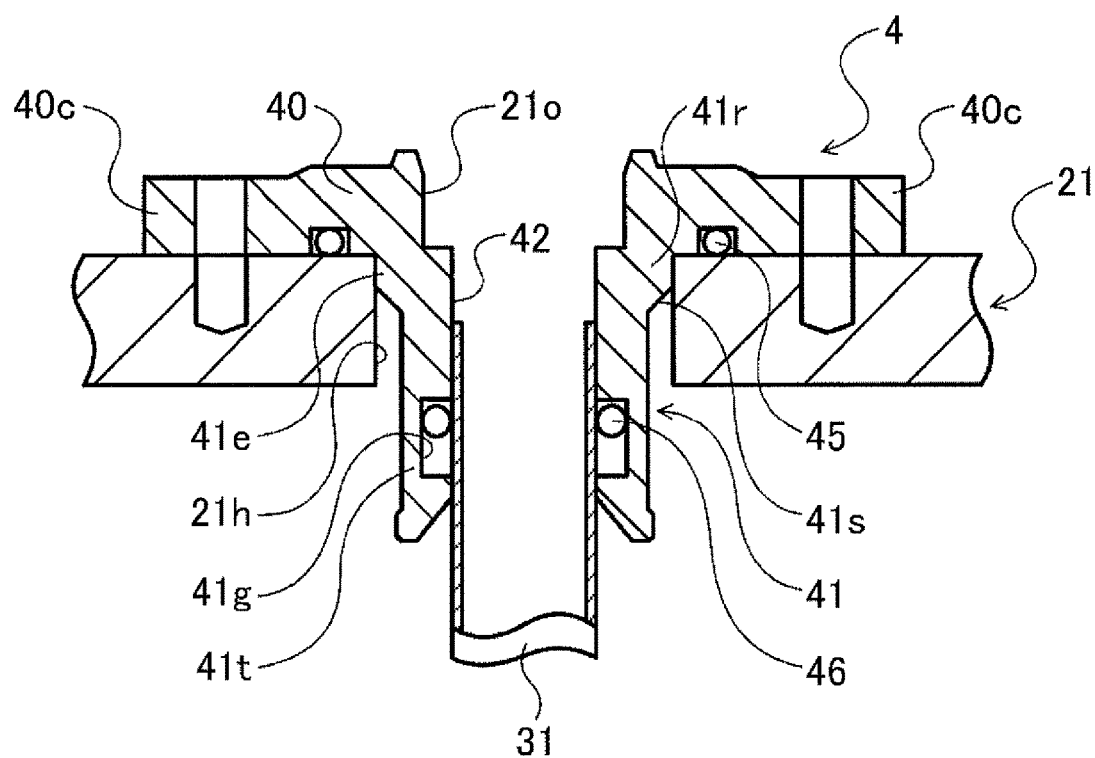
FIG. 6 is a sectional view illustrating a procedure for assembling the bush in FIG. 3 to the case.

As the first connection tube 4 is pushed onto the stacked cooler 3 side while an inclination of the coolant outflow tube 31 being corrected, as illustrated in FIG. 6, the diameter-increased portions 41e of the root portion 41r of the cylindrical portion 41 come into contact with the inner peripheral face of the through-hole 21h, and the entirety of the first connection tube 4 is thereby positioned relative to the first case 21. Consequently, the first connection tube 4 can easily be positioned relative to the first case 21 without separately providing, e.g., a positioning pin in the first connection tube 4 and providing a hole portion to be engaged with the positioning pin, in the first case 21. Also, the axial length Lt of the distal end portion 41t is made to be longer than the axial length Lr of the root portion 41r, enabling a sufficient length of parts of the distal end portion 41t and the coolant outflow tube 31, the parts overlapping each other in an axis direction of the cylindrical portion 41, to be secured. When the first connection tube 4 is positioned relative to the first case 21 by means of the diameter-increased portions 41e of the root portion 41r, displacement in position of the first connection tube 4 and the coolant outflow tube 31 relative to each other (e.g. a curve of the first connection tube 4a relative to the coolant outflow tube 31) can favorably be prevented. Furthermore, even when the coolant outflow tube 31 is inclined, the inclined surface 41s of the intermediate portion 41m between the distal end portion 41t and the root portion 41r abuts on an edge portion of the through-hole 21h, enabling the diameter-increased portions 41e of the root portion 41r to be smoothly brought into abutment with the inner peripheral face of the through-hole 21h. In addition, since in the first connection tube 4, a part of the root portion 41r except the diameter-increased portions 41e has a decreased diameter relative to the through-hole 21h of the first case 21, and when the diameter-increased portions 41e are fitted in the through-hole 21h, slight movement of the root portion 41r, that is, the first connection tube 4, relative to the through-hole 21h is allowed, enabling the inclination in the up-down direction of the coolant outflow tube 31 to be eliminated. As a result, the amount of crushing of the O-ring 46 (shaft seal member) interposed between the first connection tube 4 and the coolant outflow tube 31 extending from the stacked cooler 3 can be uniformed and the first connection tube 4 can easily be positioned relative to the first case 21.

After the first connection tube 4 being positioned relative to the first case 21 by means of the root portion 41r, as necessary, positions of the two flange fastening portions 40c of the flange portion 40 are adjusted by rotating the first connection tube 4 to some extent, to insert a bolt to the bolt hole of each flange fastening portion 40c, and each bolt is threadably connected to the corresponding screw hole of the first case 21 to fix (or fasten) the first connection tube 4 to the first case 21. Consequently, in the first case 21, a first opening 21o is defined by an end portion (mainly a part with an increased diameter) of the coolant flow hole 42 of the first connection tube 4 on the side opposite to the coolant outflow tube 31, at a distance from the second opening 22o of the second case 22 in the up-down direction (one direction) when the PCU 1 is installed in a vehicle. Also, in the first connection tube 4, the two flange fastening portions 40c are provided at the flange portion 40 so as to face each other across the seal ring groove 40g, and thus the flange portion 40 can be pressed against the first case 21 so as to prevent the flange portion 40 from being inclined relative to the first case 21. Therefore, favorable sealability of the O-ring 45 (face seal member) between the flange portion 40 and the first case 21 can be ensured, enabling prevention of flow of a fluid, that is, e.g., water from the outside and a cooling medium from the inside via a gap between the first connection tube 4 and the first case 21.

After the first connection tube 4 is attached to the first case 21, the first end portion 51 of the second connection tube 5 is inserted to the first opening 21o of the first case 21 (the end portion of the coolant flow hole 42 of the first connection tube 4), and the end face of the second end portion 52 is brought into abutment with a surface of the second case 22 around the periphery of the second opening 22o. Furthermore, bolts are inserted through the bolt hole 54h of the one first fastening portion 54 and the bolt holes 55h of the two second fastening portions 55 of the second connection tube 5, respectively, and the respective bolts are threadably connected to the corresponding screw holes of the first case 21 and the second case 22, whereby the second connection tube 5 is fixed (fastened) to the case 2. Consequently, the first end portion 51 is connected to the first opening 21o, that is, the first connection tube 4, which communicates with the coolant outflow tube 31, via the O-ring 47, which is a shaft seal member. The second end portion 52 is connected to the second opening 22o, which communicates with the coolant passage 23, via the O-ring 48, which is a face seal member.

In the present embodiment, the O-ring 47, which is a shaft seal member, is disposed between an outer peripheral face of a distal end portion (part with a decreased diameter) of the first end portion 51 and an inner peripheral face of the first opening 21o, whereby a gap between the first connection tube 4 and the second connection tube 5 is sealed by the O-ring 47. Therefore, even when only one first fastening portion 54 is provided on the first end portion 51 side (a plurality of first fastening portions 54 are not provided), favorable sealability of the O-ring 47 can be ensured. Also, in the second connection tube 5, the two second fastening portions 55 are provided so as to face each other across the seal ring groove 52g, enabling the second end portion 52 to be pressed against the second case 22 so as to prevent the second end portion 52 from being inclined relative to the second case 22. Therefore, favorable sealability of the O-ring 48 (face seal member) between the end face of the second end portion 52 and the second case 22 can be ensured.

In the PCU 1 configured as described above, the metal case 2 and the resin second connection tube 5 have different linear expansion coefficients (or heat expansion coefficients), and thus an expansion/contraction amount of the case 2 (first case 21 and second case 22) according to an ambient temperature of the PCU 1 and an expansion/contraction amount of the second connection tube 5 according to the ambient temperature are different from each other. Thus, in the PCU 1, deformation of a part between the first fastening portion 54 and the two second fastening portions 55 is limited by the first fastening portion 54 and the second fastening portions 55 following the first case 21 and the second case 22, respectively. Accordingly, in the second connection tube 5, the second fastening portions 55 are formed around the second end portion 52 while, as illustrated in FIG. 2, the first fastening portion 54 is formed further away from the second end portion in the one direction, that is, in the up-down direction when the PCU 1 is installed in a vehicle, relative to the first end portion 51.

Consequently, the distance Lc between the fastening point of the first fastening portion 54 and the fastening points of the second fastening portions 55 along the up-down direction, that is, an allowable range of deformation of the second connection tube 5 according to the ambient temperature can be expanded. Therefore, increase of stress on a portion of the welding between the body 50 and the cover member 59 due to limitation of deformation of the second connection tube 5 can favorably be prevented. As a result, a durability of the second connection tube 5 including the first fastening portion 54 and the second fastening portions 55 fastened to the case 2 can further be enhanced. Furthermore, in the second connection tube 5, part A positioned between the first end portion 51 and the first fastening portion 54 of the body 50 is thin and narrow. Consequently, deformation of the second connection tube 5 according to the ambient temperature can favorably be absorbed by part A, which is a thin and narrow deformation absorbing portion. As a result, increase of stress on the portion of the welding between the body 50 and the cover member 59 is extremely favorably prevented, enabling enhancement in durability of the second connection tube 5.

Also, when a vehicle with the PCU 1 installed therein moves, e.g., water containing sand, mud and the like, water with salt, scattered to melt snow and ice on a road, dissolved therein are sometimes taken up by the wheels and enters a compartment in which the PCU 1 is disposed. Then, when the water entering a periphery of the PCU 1 runs along surfaces of the first connection tube 4 and the first case 21 and the second case 22, reaches a periphery of the O-ring 48 (face seal member) on the second opening 22o side and accumulates there, a part of the second case 22 around the O-ring 48 corrodes, which may result in damage of the sealability of the O-ring 48 due to decrease in thickness of the second case 22. Thus, as illustrated in FIG. 7, in the first connection tube 4 of the PCU 1, the tapered portion 40t is provided that includes the inclined surface 40s positioned above the second end portion 52, that is, the O-ring 48, the inclined surface 40s being inclined further away from the surface of the second case 22 toward the lower side.

Consequently, even when water around the first connection tube 4 flows down along a surface of the flange portion 40, the flowing-down water is prevented by the provision of the tapered portion 40t from reaching the surface of the second case 22 (part X in FIG. 7) and drops down from an edge portion of the flange portion 40. Therefore, water flowing down on the surface of the flange portion 40 running along the surface of the second case 22 and flowing toward the second opening 22o and the O-ring 48 can be prevented. Consequently, water containing, e.g., sand, mud and/or salt is prevented from flowing into the periphery of the O-ring 48 on the second opening 22o side, enabling damage of the part of the second case 22 around the O-ring 48 by the water to be favorably prevented. As a result, a durability of a part of the second case 22 around the second opening 22o disposed below the first connection tube 4, the second connection tube 5 being connected to the second opening 22o, is enhanced, enabling favorable sealability of the O-ring 48 (face seal member) disposed between the second case 22 and the second connection tube 5 to be ensured.

Figure 7:
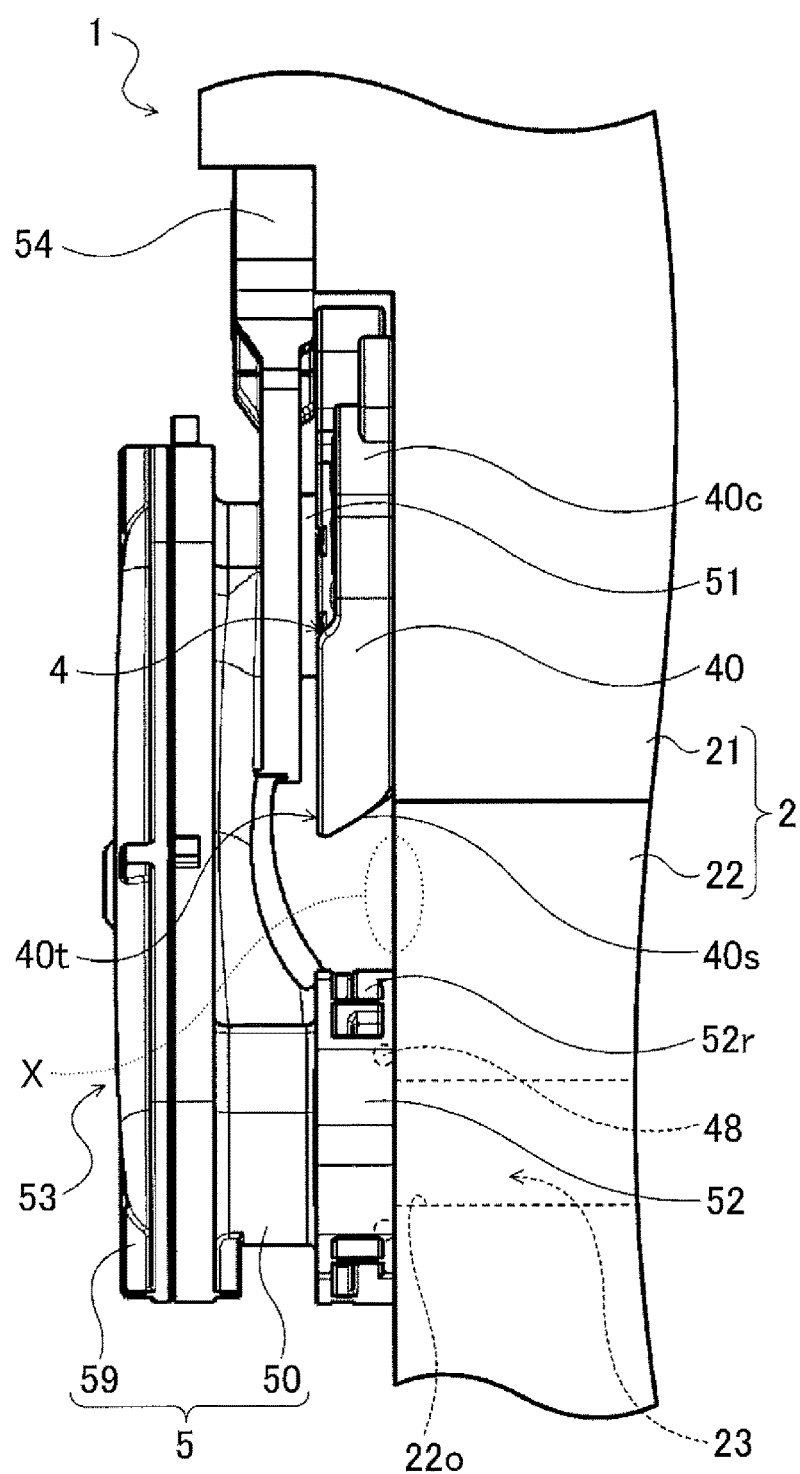
FIG. 7 is an enlarged view of a major part of the power control unit illustrated in FIG. 1.

Also, as illustrated in FIGS. 4 and 7, in the upper portion of the outer peripheral face of the second end portion 52, the water receiving groove 52r extending in the circumferential direction is formed. Consequently, water flowing down from above, that is, the first connection tube 4 side, can be collected in the water receiving groove 52r of the second end portion 52 and be made to flow downward along the outer peripheral face of the second end portion 52. As a result, water containing, e.g., sand, mud and/or salt flowing into the periphery of the O-ring 48 on the second opening 22o side is even more favorably prevented.

As described above, the second connection tube 5, which is a connection member for coolant passages in the PCU 1, is configured to connect the coolant outflow tube 31 (e.g. the first coolant passage) and the coolant passage 23 (e.g. the second coolant passage). The coolant outflow tube 31 communicates with the first opening 210 provided in the first case 21. The coolant passage 23 communicates with the second opening 22o. The second opening 22o is provided in a second case 22, at a distance from the first opening 210 in the up-down direction when the PCU 1 is installed in a vehicle. The second connection tube 5 includes the first end portion 51, the second end portion 52, the communication portion 53, the first fastening portion 54 and the second fastening portions 55. The first end portion 51 has a tubular shape and is connected to the first opening 210 via the O-ring 46, which is a shaft seal member. The second end portion 52 has a tubular shape and is connected to the second opening 22o via the O-ring 48, which is a face seal member. The communication portion 53 provides communication between the first end portion 51 and the second end portion 52. Each of the first fastening portion 54 and the second fastening portions 55 is fastened to the first case 21 or the second case 22. The first fastening portion 54 is provided at a position apart from the second end portion 52 in the up-down direction relative to the first end portion 51. The second fastening portions 55 are provided around the second end portion 52.

Consequently, in the second connection tube 5, the distance Lc between the fastening point of the first fastening portion 54 and the fastening points of the second fastening portion 55 along the up-down direction can be expanded. In other words, an allowable range of deformation of the second connection tube 5 according to an ambient temperature can be expanded. Therefore, increase of stress on the portion of the welding between the body 50 and the cover member 59 due to limitation of deformation of the second connection tube 5 can favorably be prevented. As a result, the durability of the second connection tube 5 including the first fastening portion 54 and the second fastening portions 55 each fastened to the first case 21 or the second case 22 can further be enhanced.

Also, in the above-described embodiment, the second connection tube 5 includes one first fastening portion 54, and two second fastening portions 55 around the second end portion 52. Consequently, favorable sealability of the O-ring 48, which is a face seal member, can be ensured while the distance Lc between the fastening point of the first fastening portion 54 and the fastening points of the second fastening portions 55 is made to be longer. However, only one second fastening portion 55 may be provided in the vicinity of the second end portion 52 or three or more second fastening portions 55 may be provided around the second end portion 52.

Furthermore, in the above-described embodiment, the second connection tube 5 includes the first end portion 51, the second end portion 52, the body 50 and the cover member 59. The body 50 includes the opening portion 50o. The opening portion 50o communicates with the first end portion 51 and the second end portion 52 on the side opposite to the case 2 side. The body 50 includes the first fastening portion 54 and the second fastening portions 55. The cover member 59 is joined to the body 50 so as to occlude the opening portion 50o. Employment of such configuration above enables the U-shaped second connection tube 5 to be formed by a resin more easily. In addition, in the second connection tube 5, the distance Lc between the fastening point of the first fastening portion 54 and the fastening points of the second fastening portions 55 is made to be longer, enabling decrease of stress generated in the portion of the welding between the body 50 and the cover member 59 each made of a resin, and thus enabling enhancement in durability of the second connection tube 5. The first fastening portion 54 and the second fastening portions 55 are fastened to the first case 21 or the second case 22, respectively.

Also, as in the above embodiment, even when there is a difference in linear expansion coefficient (or heat expansion coefficient) between the case 2 made of a metal, and the second connection tube 5 (e.g. the body 50 and the cover member 59) made of a resin, the distance Lc is made to be longer, enabling favorable prevention of increase of stress on the particular part (welding portion) of the second connection tube 5 due to limitation of deformation of the second connection tube 5 according to an ambient temperature.

Furthermore, in the above embodiment, the first connection tube 4 is attached to the first ease 21. The first connection tube 4, which is a bush including the coolant flow hole 42, is connected to the coolant outflow tube 31 (first coolant passage) via the O-ring 46, which is a shaft seal member. The O-ring 45, which is a face seal member, is disposed between the first case 21 and the flange portion 40 of the first connection tube 4. The first opening 210 of the first case 21 is defined by the end portion of the coolant flow hole 42 of the first connection tube 4 on the side opposite to the coolant outflow tube 31. Consequently, leakage of the cooling medium between the coolant outflow tube 31 and the second connection tube 5 can favorably be prevented, and flow of a fluid via the gap between the first connection tube 4 and the first case 21 can favorably be restricted. However, the first opening 210 may be provided directly in a wall portion of the first case 21.

Also, in the above embodiment, the first case 21 houses the stacked cooler 3 that cools semiconductor modules M that are electronic components included in the inverter that drives the motor. The coolant outflow tube 31 is connected to the stacked cooler 3. Also, the coolant passage 23 is formed in the second case 22. Consequently, the inverter can be cooled by both the stacked cooler 3 and the cooling medium flowing through the coolant passage 23. It is only necessary that the second connection tube 5 be one that provides communication between two openings communicating with respective coolant passages, and an object to which the second connection tube 5 is to be applied is not limited to the PCU 1 such as described above. In other words, the second connection tube 5 may be configured to, for example, provide communication between two openings communicating with respective coolant passages for cooling a vehicle battery. Furthermore, the shaft seal members and the face seal members used together with the first connection tube 4 and the second connection tube 5 are not limited to the O-rings such as described above, and may be seal members such as, for example, D-rings.

The present disclosure is not limited by the above-described embodiment in any way, and it should be understood that various alternations are possible within a range of extension of the present disclosure. Furthermore, the above-described embodiment of the disclosure is definitely a mere specific mode of the disclosure stated in the Summary section, and is not intended to limit the elements of the disclosure stated in the Summary section.

The present disclosure can be used in, e.g., the field of manufacture of coolant passage connection members and cooler systems.

What is claimed is:

1. A power control system for coolant passages including a first coolant passage and a second coolant passage, the first coolant passage being disposed in a case, and the second coolant passage in communication with a second opening, the power control system comprising:
    a first connection member including:
        a distal end portion configured to encircle the first coolant passage and seal against the first coolant passage via a first shaft seal member; and
        an intermediate end having a first opening in communication with the first coolant passage; and
    a second connection member including:
        a first end portion configured to be connected to the first opening of the first connection member and sealed against the first opening via a second shaft seal member, the first end portion having a tubular shape;
        a second end portion configured to be connected to the second opening via a face seal member, the second end portion having a tubular shape;
        a communication portion that communicates the first end portion with the second end portion;
        a first fastening portion disposed at a position in a first direction such that a first distance between the first fastening portion and the second end portion is greater than a second distance between the first fastening portion and the first end portion, the first fastening portion being configured to be fastened to the case, the first fastening portion being disposed on an opposite side of the first end portion relative to the second end portion;
        at least two second fastening portions disposed around the second end portion so as to face each other in a radial direction across the second end portion, the radial direction being perpendicular to the first direction, the two second fastening portions being configured to be fastened to the case; and
        a body including the first fastening portion and the two second fastening portions, the two second fastening portions being formed in the body.

2. The power control system according to claim 1, wherein the second connection member includes only one first fastening portion.

* * * * *